METHOD OF JUNCTION PASSIVATION AND PRODUCT

Filed July 17, 1962 2 Sheets-Sheet 1

HARRY E. FISHER
ELAM C. FRYE, JR.
MILTON K. HICKS
CHARLES R. SCHRAEDER

INVENTORS

BY D. Carl Richards
ATTORNEY

United States Patent Office 3,300,841
Patented Jan. 31, 1967

3,300,841
METHOD OF JUNCTION PASSIVATION AND PRODUCT

Harry E. Fisher and Elam C. Frye, Jr., Richardson, Milton K. Hicks, Hurst, and Charles R. Schraeder, Richardson, Tex., assignors to Texas Instruments Incorporated, Dallas, Tex., a corporation of Delaware
Filed July 17, 1962, Ser. No. 210,330
3 Claims. (Cl. 29—155.5)

This invention relates to semiconductor devices and more particularly to a method and system embodying passivation of surface exposed junction areas in semiconductor devices.

It has been found that a primary factor in semiconductor device performance is the condition of the semiconductor surface. The reliability of the device over a period of time is dependent upon maintenance of the surface in its original condition even under adverse conditions. In order to obtain an optimum surface, it is necessary to eliminate or preclude the deposition of contaminants of a polar nature or of any substance that might break down or change its characteristics to form polar contaminants on the surface of the semiconductor body near the junction therein. It has been found desirable and often necessary to exclude all surface-surface coating interfaces in order to exclude all channels and paths that might become conductive.

In accordance with the prior art, attempts have been made to create a surface with the above-noted desirable attributes. Chemically etched surfaces have been dried and coated with silicone oil or grease. Coatings of silicon varnishes and alkyd-silicone combination resins were also employed. This was followed by the formation on the surface of silicon devices, for example, of a silicon-oxide layer. To such oxide layers there was attempted to add impurities which were thought to have stabilizing effects. The thickness of the oxide layer was also varied in an attempt to achieve the desired result.

In all the known prior art systems, limitations involving one or more factors detrimental to device reliability have been present. Further, in prior art devices, it has been impossible to seal glass to a wafer with plugs of metal on each end. An oxide layer on the wafer makes this possible in accordance with the present invention.

More particularly, in accordance with the present invention, there is provided a method for the manufacture of a stable semiconductor device. There is employed a method for treating a clean semiconductor P-N junction area which involves covering the junction area with an oxide layer. Thereafter, the device with the oxide layer thereon is baked in an inert atmosphere at a high temperature for time sufficient to remove absorbed and adsorbed moisture. Immediately thereafter and without exposing the device to possible contaminants, a layer of glass is fused over the oxide layer which is non-contaminating and which closely matches the coefficient of expansion of the semiconductor. Thereafter the device thus passivated is encapsulated and provided with the necessary leads in order to facilitate use thereof.

This surface protection permits encapsulation in a glass package with metal leads in a single sealing operation at temperatures of the order of 1000° C. For a more complete understanding of the present invention and for further objects and advantages thereof, reference may now be had to the following description taken in conjunction with the accompanying drawings in which.

Figure 1:
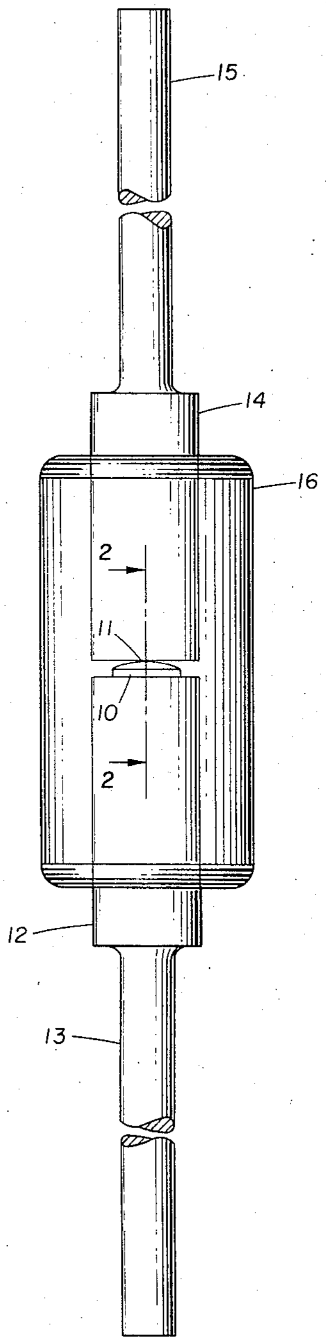
FIGURE 1 illustrates one embodiment of the present invention.

Referring now to FIGURE 1, a passivated diode of the mesa type is encapsulated in a suitable housing from which requisite leads extend. More particularly, the diode 10 is provided with a mesa zone 11 and is supported with the base in contact with a metallic cylinder 12 from which there extends a lead 13. The mesa area 11 of the device 10 is maintained in contact with a second cylinder 14 having attached thereto a lead 15. The entire device is enclosed by a glass shield 16.

Figure 2:
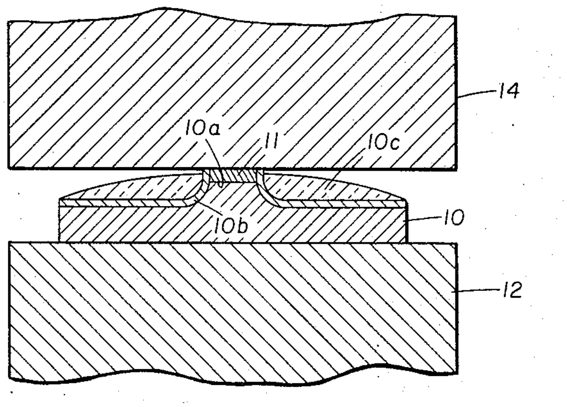
FIGURE 2 is a sectional view taken along line 2—2 of FIGURE 1.

Details of the structure of FIGURE 1 are best shown in the detailed sectional view of FIGURE 2. The semiconductor wafer 10 having the mesa 11 is formed with a P-N junction 10*a* extending across the mesa portion 11. An oxide layer 10*b* is formed over the upper surface of the wafer 10 and covers the emergence at the surface of the junction 10*a*. Over the oxide layer 10*b* there is a body or coating of a glass which forms layer 10*c*. The lower surface of the wafer 10 is in direct contact with cylinder 12 to provide a conductive connection thereto. The upper exposed surface of the mesa 11 is in direct contact with the cylinder 14. The device thus formed has been found to be stable in operation at high temperatures for extended periods of time.

The present method of producing the semiconductor device consists of four main parts. First, a semiconductor wafer with the junction 10*a* therein is suitably etched to form the mesa thereon. Following etching operations the device is cleaned and covered with an oxide layer. The oxide layer may be formed in accordance with existing and known techniques. Applicants have found, however, that in the general case as the oxide layer is formed, moisture remains either absorbed or adsorbed in or on the oxide layer or at the interface between the layer and the wafer. With the foregoing in mind, the second step coupled with the third step has been found to be critical in achieving a stable device. The second step involves baking the oxide covered semiconductor device in an inert atmosphere such as helium at high temperatures and for a period of time sufficient to remove all absorbed or adsorbed moisture. The third step involves sealing off any pin holes in the oxide layer by means of a layer of glass. The glass employed is of non-contaminating character and closely matches the coefficient of expansion of the semiconductor body. This step follows immediately the baking step so that the glass layer is fused to a clean dry oxide surface immediately following high temperature moisture bakeout. The foregoing operations effectively passivate the semiconductor junction 10*a* and protect it from the adverse ambient conditions to which the device may be subjected in use.

A semiconductor device prepared in this manner can then be packaged in a fourth step wherein it may be encapsulated in the glass sleeve 16 which is fused to the contact cylinders 12 and 14.

The high temperature bakeout is designed to remove all moisture possible from the oxide and from the oxide semiconductor interface.

It has been found that a diode of the type illustrated in FIGURE 1, when formed in accordance with the foregoing method, has exhibited stability not heretofore achieved. Such device is capable of high temperature operation as high as 125° to 150° C. in excess of 1000 hours. Further, it will withstand high temperature storage, that is, in atmospheres of 300° to 350° C. in excess of 1000 hours. Eliminated from the structure of FIGURE 1 are pressure and whisker type contacts to the semiconductor body such as known in the prior art. Thus, the device lends itself readily to automated production techniques.

Diodes produced in accordance with the foregoing method have been found to exhibit the following desirable characteristics. A correlation study of high temperature D.C. blocking tests versus high temperature operating life tests has shown the D.C. blocking requirements to be more severe than the A.C. life test. Experiments on devices of the type shown in FIGURE 1 with D.C. blocking at 150° C. and with the reverse voltage ($V_R$) equal to 80% of the peak inverse voltage (PIV) have led to the following conclusions:

(1) Devices made without bakeout and glass but with an oxide layer exhibited a change in reverse current ($I_R$) by a factor of 1000 or more and change in the shunt capacitance ($C_s$) by a factor of from a minimum of 2 to as great as 10.

(2) Devices made with the oxide layer baked out prior to encapsulation cured the $I_R$ drift but $C_s$ still changed by as much as a factor of 4.

(3) Devices made with glass over the oxide but with no bakeout prior to application of glass cured the $C_s$ drift, but $I_R$ still changed by a factor of from 2 to 1000.

(4) Devices made with the oxide layer baked out prior to an application of a layer of glass showed no drift on either $I_R$ or $C_s$.

Figure 3:
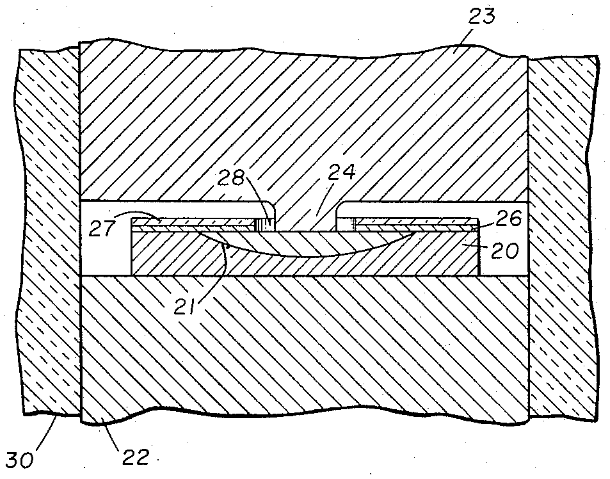
FIGURE 3 illustrates a modification of the invention.
Figure 4:
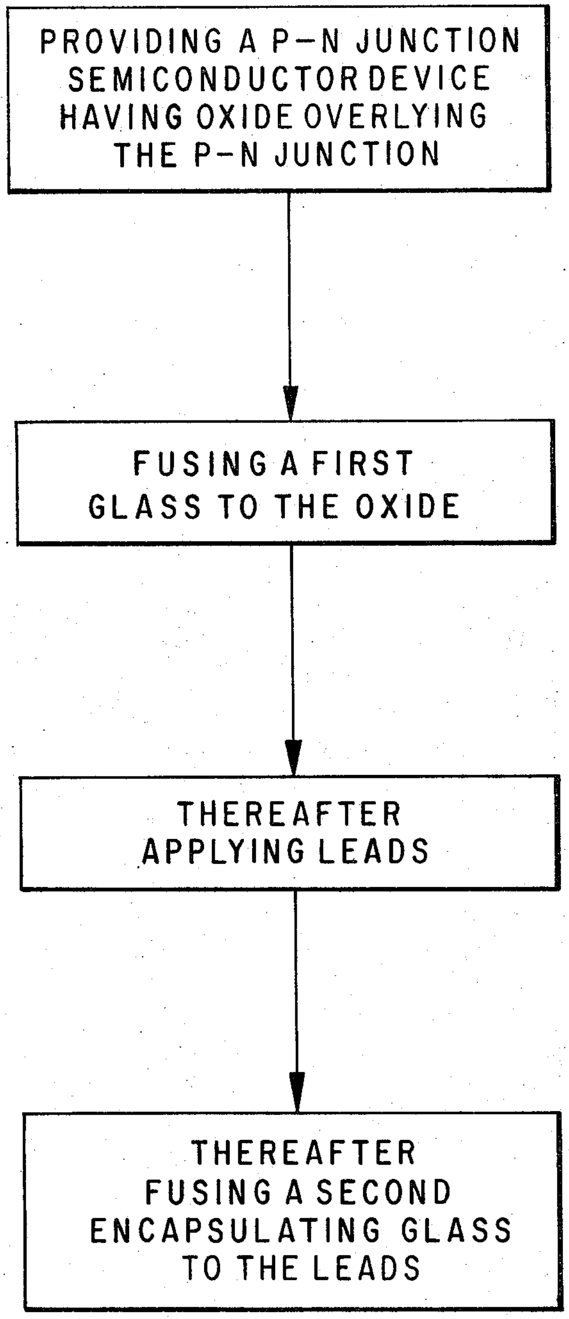
FIGURE 4 is a flow diagram illustrating the process oi the invention.

Having described a relatively simple mesa type diode such as shown in FIGURE 1, it will now be understood that a like process may be employed for a planar type structure such as the planar diode shown in FIGURE 3.

FIGURE 3 illustrates a planar type diode 20 having a dish-shaped junction 21. The wafer 20 rests on a lower contact cylinder 22. The upper contact cylinder 23 has an axial extension 24 of substantially reduced diameter, the face of which rests on the upper surface of the wafer 20 and is limited in its contact to the area inside the junction 21. An oxide layer 26 is formed on the upper surface of the wafer 20 over which is a glass layer 27. The extension 24 extends through a central aperture 28 in the layers 26 and 27. In forming the unit 20, the same general procedures are followed as in forming the units of FIGURES 1 and 2. The oxide coating is formed over the surface. It is then baked out for removal of any adsorbed or absorbed moisture. The passivating glass layer 27 is then formed on the upper surface following which the aperture 28 is formed for exposing the contact area. The entire structure is then sealed in a cylinder such as the glass body 30.

While the invention has been described in connection with the treatment of diode structures, it is to be understood that multijunction semiconductor devices may be similarly treated wherein an oxide layer is formed as to cover the surface areas at which the junctions emerge. Thereafter, the device is subject to high temperature bakeout for a length of time sufficient to remove all water or moisture absorbed or adsorbed in the oxide layer or on the oxide-semiconductor interface. Thereafter, while maintaining the device at elevated temperature immediately following the bakeout, a glass coating is applied to the surface areas of junction emergence. The coating is of character such that it will not contaminate the semiconductor device and has thermal characteristics which correspond with that of the semiconductor body. It will be understood that the junction or junctions may be formed in a wafer either before or after formation of an oxide coating bakeout and application of the final coating.

The foregoing procedures shall be understood as applicable to production of germanium and other devices although a silicon device has been described in the above example. A suitable glass for use in such a system has been described and claimed in an application of James H. Eddleston, Serial No. 181,857, filed March 23, 1962.

More particularly, such glass may have the following composition:

| | Percent |
|---|---|
| Lead oxide | 50 |
| Silicon dioxide | 40 |
| Aluminum oxide | 10 |

The constituents of the glass are maintained substantially free of any trace elements that are not neutral in the semi-conductor device.

A lead oxide is employed with low level impurities, being of the order of 99.9999% pure lead oxide. Similarly, silicon dioxide and aluminum oxide of as high purity as available are employed.

The proportions in the major components of the glass formed of the foregoing composition though of importance are not as critical as the trace element constituents therein. For semiconductor devices of Group IV doped with elements of Group III or Group V traces elements in Group III and Group V preferably are to be eliminated and must be minimized. Therefore, substantially pure components are employed.

For germanium devices glass of the same constituents would be employed, but preferably in the following proportions:

| | Percent |
|---|---|
| Lead oxide | 60 |
| Silicon dioxide | 30 |
| Aluminum oxide | 10 |

In either case, the glass is one in which contaminant trace elements are substantially eliminated but which has bulk characteristics such as a thermal coefficient of expansion corresponding with that of the semiconductor device.

The major constituents of the glass are lead oxide and silicon dioxide. The relative proportions of the major constituents may be varied to form a coating having the same bulk characteristics as the device to be passivated. The minor constituent, aluminum oxide, has been held constant in the examples given but may be subject to variation.

Tolerable levels of non-neutral trace elements are difficult to specify since measurement of trace concentrations involved are difficult if not impossible. Since the devices themselves possess characteristics which are controlled by trace quantity doping levels, the doping constituents in the passivating coating must be far below the level of doping in the device itself. In order to provide a usable passivating coating, materials of as high purity as obtainable have been employed. More particularly, where available the three constituents of the glass each have been 99.9999% free from any other constituent.

It is to be understood that impurities of relatively high concentration may be tolerated only if they are neutral. Silicon and germanium devices are doped with non-neutral elements from Groups III and V for producing P- and N-regions, respectively. Devices made from gallium arsenide and from other Group III and Group V compound semiconductors are doped with non-neutral elements from groups II and IV for producing P-regions and and with elements from Groups IV and VI for producing N-regions. The passivating composition must be maintained substantially free of the doping elements.

Having described the invention in connection with certain specific embodiments thereof, it is to be understood that further modifications may now suggest themselves to those skilled in the art and it is intended to cover such modifications as fall within the scope of the appended claims.

What is claimed is:

1. The method of fabricating a semiconductor device of the type having at least one P-N junction emerging at a surface of a semiconductor body and an oxide layer adjacent said surface over a point of the emergence of said P-N junction, comprising the steps of:

(a) fusing to the surface of said oxide layer a first glass, said first glass being substantially free of contaminants and having a thermal coefficient of expansion substantially corresponding with that of said semiconductor body, (b) thereafter establishing contact with conductive leads at exposed surface areas of said body in at least two zones on opposite sides of said at least one P-N junction, and (c) thereafter fusing a second glass solely to said conductive leads, thereby encapsulating said body.

2. The method of producing a passivated semiconductor device having at least one P-N junction emerging at surface areas thereof, which comprises:

(a) forming an oxide layer over said surface areas of said device, (b) maintaining said device in an inert atmosphere at an elevated temperature for a period of time to remove all moisture from within and on said oxide layer, (c) thereafter maintaining said device in said inert atmosphere, and fusing to the surface of said oxide layer a layer of glass substantially free of contaminants and of thermal coefficient of expansion corresponding with the thermal coefficient of expansion of said device, (d) thereafter establishing contact with conductive leads at exposed surface areas of said device in at least two zones on opposite sides of said junction, and (e) fusing a second glass to said conductive leads, thereby encapsulating said device.

3. The method of producing a passivated semiconductor device having at least one P-N junction emerging at surface areas thereof, which comprises:

(a) forming an oxide layer over said surface areas of said device, (b) maintaining said device in an inert atmosphere at an elevated temperature for a period of time to remove all moisture from within and on said oxide layer, (c) thereafter maintaining said device in said inert atmosphere, and fusing to the surface of said oxide layer, a layer of glass substantially free of contaminants and of thermal coefficient of expansion corresponding with the thermal coefficient of expansion of said device, (d) thereafter establishing contact with conductive leads at exposed surface areas of said device in at least two zones on opposite sides of said junction, and (e) fusing a glass shield to said conductive leads at a temperature of the order of 1000° C. to encapsulate said device.

References Cited by the Examiner

UNITED STATES PATENTS

| | | | |
|---|---|---|---|
| 2,174,840 | 10/1939 | Robinson et al. | 317—230 |
| 2,899,344 | 8/1959 | Atalla et al. | 317—235 |
| 2,973,466 | 2/1961 | Atalla et al. | 317—240 |
| 2,998,558 | 8/1961 | Maiden et al. | 317—234 |
| 3,024,119 | 3/1962 | Flaschen et al. | 117—201 |
| 3,067,485 | 12/1962 | Ciccoletta et al. | 317—235 |
| 3,093,507 | 6/1963 | Lander et al. | 117—201 |
| 3,189,799 | 6/1965 | Moroney | 317—234 |

FOREIGN PATENTS

| | | |
|---|---|---|
| 1,267,686 | 6/1961 | France. |

JOHN W. HUCKERT, *Primary Examiner.*

DAVID J. GALVIN, *Examiner.*

J. D. KALLAM, A. M. LESNIAK, *Assistant Examiners.*